United States Patent
Chen et al.

(10) Patent No.: US 7,369,410 B2
(45) Date of Patent: May 6, 2008

(54) APPARATUSES FOR DISSIPATING HEAT FROM SEMICONDUCTOR DEVICES

(75) Inventors: Howard Chen, Yorktown Heights, NY (US); Hsichang Liu, Fishkill, NY (US); Louis Hsu, Fishkill, NY (US); Lawrence Mok, Brewster, NY (US)

(73) Assignee: International Business Machines Corporation, Armonk, NY (US)

(*) Notice: Subject to any disclaimer, the term of this patent is extended or adjusted under 35 U.S.C. 154(b) by 49 days.

(21) Appl. No.: 11/416,762

(22) Filed: May 3, 2006

(65) Prior Publication Data
US 2007/0258213 A1 Nov. 8, 2007

(51) Int. Cl.
*H05K 7/20* (2006.01)

(52) U.S. Cl. ............... 361/701; 361/700; 361/703; 165/80.4; 165/104.21; 165/104.26; 165/104.33; 257/714; 257/715

(58) Field of Classification Search ........ 361/697–702, 361/704–712, 719–722; 165/80.4, 80.5, 165/104.21–104.27, 104.33, 104.34; 257/714, 257/715; 62/259.2
See application file for complete search history.

(56) References Cited

U.S. PATENT DOCUMENTS

| | | | |
|---|---|---|---|
| 5,168,919 A * | 12/1992 | Berenholz et al. | 165/80.4 |
| 5,216,580 A * | 6/1993 | Davidson et al. | 361/700 |
| 5,508,884 A * | 4/1996 | Brunet et al. | 361/698 |
| 6,005,772 A * | 12/1999 | Terao et al. | 361/699 |
| 6,062,302 A * | 5/2000 | Davis et al. | 165/104.26 |
| 6,085,831 A | 7/2000 | DiGiacomo et al. | |
| 6,237,223 B1 * | 5/2001 | McCullough | 29/890.032 |
| 6,410,982 B1 * | 6/2002 | Brownell et al. | 257/714 |
| 6,490,160 B2 * | 12/2002 | Dibene et al. | 361/700 |
| 6,681,843 B2 * | 1/2004 | Sugito | 165/104.33 |
| 6,695,039 B1 * | 2/2004 | Reyzin et al. | 165/104.21 |
| 6,738,257 B1 * | 5/2004 | Lai | 361/700 |
| 6,820,684 B1 * | 11/2004 | Chu et al. | 165/104.33 |
| 6,827,134 B1 * | 12/2004 | Rightley et al. | 165/104.26 |
| 6,910,794 B2 * | 6/2005 | Rice | 362/547 |
| 7,017,657 B2 * | 3/2006 | Sugito et al. | 165/104.21 |
| 2002/0118511 A1 * | 8/2002 | Dujari et al. | 361/703 |
| 2004/0105235 A1 * | 6/2004 | Lai | 361/700 |
| 2005/0028965 A1 * | 2/2005 | Chen | 165/104.21 |
| 2005/0173098 A1 * | 8/2005 | Connors | 165/104.33 |
| 2006/0039111 A1 * | 2/2006 | Huang | 361/698 |
| 2006/0118280 A1 * | 6/2006 | Liu | 165/104.33 |
| 2006/0196640 A1 * | 9/2006 | Siu | 165/104.26 |

FOREIGN PATENT DOCUMENTS

| | | | |
|---|---|---|---|
| JP | 409017920 A | * | 1/1997 |
| JP | 11330747 A | * | 11/1999 |

\* cited by examiner

*Primary Examiner*—Michael Datskovskiy
(74) *Attorney, Agent, or Firm*—Brian P. Verminski

(57) ABSTRACT

An apparatus for providing two-phase heat transfer for semiconductor devices includes a vapor chamber configured to carry a cooling liquid, the vapor chamber having base section, and a plurality of three-dimensional (3D) shaped members. The plurality of 3D-shaped members have interior and exterior sidewalls, the 3D-shaped members being connected to the base section so that vapor carrying latent heat can reach the respective interior sidewalls and get transferred to the respective exterior sidewalls configured to be in contact with an external coolant. The vapor chamber is configured to be in contact with a semiconductor device in order to remove heat therefrom.

4 Claims, 4 Drawing Sheets

100

200

500

600

700

APPARATUSES FOR DISSIPATING HEAT FROM SEMICONDUCTOR DEVICES

BACKGROUND OF THE INVENTION

1. Field of the Invention

Aspects of the invention generally relate to heat transfer and, more specifically, to vapor chamber structures for efficient dissipation of heat from semiconductor devices.

2. Description of Related Art

Removal of excessive heat from electronic packages using heat sinks is known in the semiconductor industry. To meet the increasing demand of heat flux density for high-power electronic products, various heat sink designs have been used. For example, tall, thin, flat fins can provide more cooling surface area for convective heat removal, and lower pressure drop for greater airflow. Further, the heat transfer coefficient (measured in watts per surface area per degree Celsius), and the temperature gradient, can be increased by crosscutting flat fins into multiple short sections if the direction of airflow is random. The leading and trailing edges of a fin can be augmented with a curvature on the surface to scrub dead air when air velocity is high. To overcome the extrusion ratio limit, i.e. the aspect ratio of fin height to spacing, during the extrusion process, fins can be assembled and bonded to a separate base to significantly increase the cooling surface area. Corrugated metal sheet can also be used as lightweight folded fins to increase the cooling surface area.

In addition to improved fin efficiency, an ideal heat sink is desired to be made of materials that have high thermal conductivity, high machinability, low cost, low weight, and low toxicity. However, most materials that offer better properties than aluminum often are expensive to manufacture. For example, copper (390 W/m-K) offers higher thermal conductivity than aluminum (230 W/m-K), but it weighs 3 times heavier and is more difficult to machine. Graphite composite, on the other hand, is lighter but has anisotropic thermal conductivity.

Since air is a not a good agent for heat transfer due to its low specific density, low specific heat, and low thermal conductivity, alternative technologies that offer higher heat removal capacities have been proposed to replace the traditional low-cost and low-maintenance air-cooling technologies. For example, the use of liquid, typically a water and glycol mixture, instead of air not only reduces the size of the heat sink while eliminating fan noise, but also easily removes heat from its source, thereby increasing system reliability.

Heat pipes and vapor chambers are other promising technologies based on the principle of two-phase heat exchange. In a typical tubular heat pipe, where a vacuum-tight pipe having a wick structure and working fluid is used to connect an evaporator unit and a condenser unit, heat generated in the evaporator unit vaporizes the liquid in the wick. The vapor then carries the latent heat of vaporization and flows into the cooler condenser unit, where it condenses and releases the heat. The condensed liquid is returned to the evaporator unit through the capillary action of the wick structure. The phase change, caused by vaporization and condensation, and the two-phase flow circulation continue until the temperature gradient between the evaporator and the condenser no longer exists.

Compared to a solid material such as aluminum that removes heat through thermal conduction, an average heat pipe that transports latent heat through vapor flow has an equivalent thermal conductivity more than 1000 W/m-K. A pump with micro-channels may be used if the condenser unit is far from the evaporator unit. Although water can be used as the working fluid for a wide range of temperatures, other materials such as methanol, ammonia, propylene, ethane, nitrogen, oxygen, and hydrogen are more suitable for low-temperature operation. For high-temperature operations, alkali metals such as cesium, potassium, sodium, and lithium appear to be more suitable.

The passive nature and nearly isothermal heat transfer of the heat pipe technology make it attractive in many cooling and thermal control applications. More recent heat pipes have sintered wicks that could return liquid against gravity by capillary flow and provide a higher heat flux handling capability.

Similar to heat pipe, which is a closed-loop, phase-change heat transfer system, a vapor chamber provides flat plate on the surface of heat source and allows direct attachment to a heat sink. In U.S. Pat. No. 6,085,831, entitled "Direct chip-cooling through liquid vaporization heat exchange" discloses a mechanism for dissipating heat from a chip. One of the drawbacks of this proposal is the limited surface area available for cooling the vapor as the interior fins inside the heat sink enclosure are not in direct contact with the cooler ambient that is outside the heat sink. To enhance heat exchange efficiency, the enclosure must be significantly larger than the conventional air-cooled heat sink to provide the necessary heat removal capacity. Since the internal fins generally provide lower cooling efficiency than external fins, it is therefore desirable to overcome the drawbacks associated with earlier designs.

SUMMARY OF THE INVENTION

Aspects of the invention relate to a fin-shaped vapor chamber for efficient two-phase heat transfer. More specifically, aspects of the invention disclose a wick-assisted three-dimensional (3D) shaped (e.g., fin-shaped) vapor chamber structure that can be combined with other cooling mechanisms to provide efficient two-phase heat transfer for semiconductor devices. Based on the chip orientation and package configuration, a plurality of hollow fin designs are proposed to increase the surface area of vapor chamber and improve the two-phase cooling efficiency relative to conventional heat pipes and vapor chambers. Each enclosed vapor chamber is to be partially filled with a liquid-phase material whose low boiling temperature allows it to be evaporated by absorbing the heat from the chip and condensed by air cooling or liquid cooling of the fin chambers. Specific 3D-shaped vapor chamber designs with wick structures are provided for chips that are mounted horizontally, vertically, stacked vertically, or mounted at an angle. It will be appreciated that fin-shaped vapor chamber design is an example of a 3D-shaped vapor chamber design. As such, other 3D-shapes can be used.

In one aspect, an apparatus for providing two-phase heat transfer for semiconductor devices includes a vapor chamber configured to carry a cooling liquid, the vapor chamber having base section, and a plurality of 3D-shaped members. The plurality of 3D-shaped members have interior and exterior sidewalls, the 3D-shaped members being connected to the base section so that vapor carrying latent heat can reach the respective interior sidewalls and get transferred to the respective exterior sidewalls configured to be in contact with an external coolant. The vapor chamber is configured to be in contact with a semiconductor device in order to remove heat therefrom.

In another aspect, an apparatus for removing excessive heat from semiconductor devices includes a vapor chamber configured to carry a cooling liquid, the vapor chamber having base section, and a plurality of 3D-shaped members. The 3D-shaped members have interior and exterior sidewalls, the 3D-shaped members being connected to the base section so that vapor carrying latent heat can reach the respective interior sidewalls and transfer to the respective exterior sidewalls. A conduit having first and second ends and carrying a coolant is disposed to be in contact with the 3D-shaped members and configured to transfer heat from the exterior sidewalls of the 3D-shaped members to the coolant flowing through the conduit. The vapor chamber is configured to be in contact with a semiconductor device in order to remove heat from the semiconductor device.

In a yet another aspect, an apparatus for removing heat from a semiconductor structure includes a top vapor chamber having a plurality of 3D-shaped members and disposed on top of the semiconductor structure; a plurality of side vapor chambers each having another set of a plurality of 3D-shaped members. The side vapor chambers are disposed to surround the semiconductor structure. The top vapor chamber and the side vapor chambers are configured to be fluidly coupled to enable transfer of fluid between the top and side vapor chambers. The side vapor chambers are mounted at an angle to enable backflow of condensed fluid by gravity towards a base portion of the semiconductor structure, the base portion being in contact with a chip carrier. The top vapor chamber and the side vapor chambers are filled with a coolant so as to completely cover sidewalls and top exterior surface of the structure in order to provide maximum surface contact and cooling capacity.

In a further aspect, an apparatus for removing heat from a semiconductor device includes a solid heat sink; a vapor chamber in thermal contact with the heat sink on one side and the semiconductor device on an opposite side, each of the heat sink and the vapor chamber having a plurality of 3D-shaped members. The vapor chamber is filled with a coolant to a level so as to cover an entire surface of the semiconductor device.

In an additional aspect, an apparatus for removing heat from a semiconductor device includes a vapor chamber in thermal contact with a semiconductor device, the vapor chamber having a plurality of 3D-shaped members, the vapor chamber configured to extend beyond a length of the semiconductor device; a thermally-conductive material coated as a porous film on a side surface of the vapor chamber, the side surface being in thermal contact with the semiconductor device. The vapor chamber if filled with a coolant to a level so as to cover an entire surface of the semiconductor device.

BRIEF DESCRIPTION OF THE DRAWINGS

The foregoing and other aspects of embodiments of this invention are made more evident in the following Detailed Description of Exemplary Embodiments, when read in conjunction with the attached drawings, wherein.

DETAILED DESCRIPTION OF THE PREFERRED EMBODIMENTS

Figure 1:
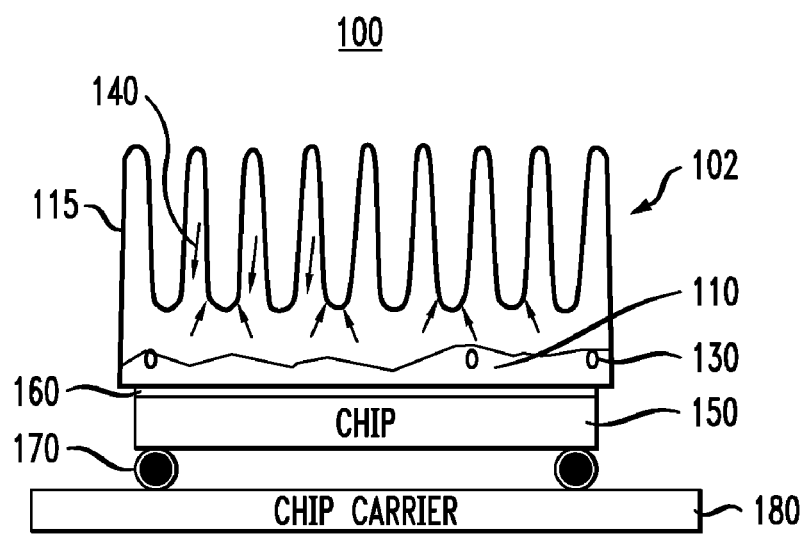
FIG. 1 shows a perspective view of an air-cooled fin-shaped hollow heat sink that is partially filled with working fluid in accordance with an exemplary embodiment of the invention.

Referring to FIG. 1, there is shown a perspective view of a heat dissipation module 100. The module 100 includes an air-cooled fin-shaped hollow heat sink 102 that is partially filled with working fluid in accordance with an exemplary embodiment of the invention. The heat sink 102 has a base section in close proximity to a chip, a plurality of three-dimensional (3D) shaped members 115. In one exemplary embodiment, the 3D shaped members 115 can be in the form of fin-shaped members. Other 3D shapes can be used. The heat sink 102 includes a large surface area but with an enclosed cavity inside. The heat sink 102 is also referred herein as a vapor chamber that can be manufactured by using, for example, molding, welding, or other low-cost means to form an extrusion-type heat sink container with a large surface area. However, instead of using a solid fin structure, the fins 115 are constructed with a hollow chamber connected to a base chamber so that vapor carrying latent heat can reach an interior sidewall of the fin 115 where heat can be directly transferred to the exterior sidewall that is in direct contact with a coolant disposed outside of the fins 115. The heat sink 102 is partially filled with a liquid phase material 110 whose boiling point (e.g., low boiling point) falls within target range under vacuum or other designated pressure conditions. The heat sink 102 can be placed on top of a heat source such as chip 150. A thermal interface material 160 can be used to join the heat sink 102 to one side of the chip 150. The other side of the chip 150 is electrically connected to chip carrier 180 using solder balls 170.

As the temperature of the chip 150 rises, the liquid 110 disposed in the heat sink 102 starts to vaporize. When vapor 130 rises and contacts the interior cold surface of the fins 115, the vapor condenses releasing the latent heat of vaporization. As condensation occurs, condensed liquid 140 falls back to the base of the heat sink 102. Space occupied by the module 100 can be comparable to conventional models. Forced air such as high-speed air flow can be applied directly to the outer sidewalls of the fins 115 to effectively cool the vapor of the evaporated liquid 110.

Figure 2:
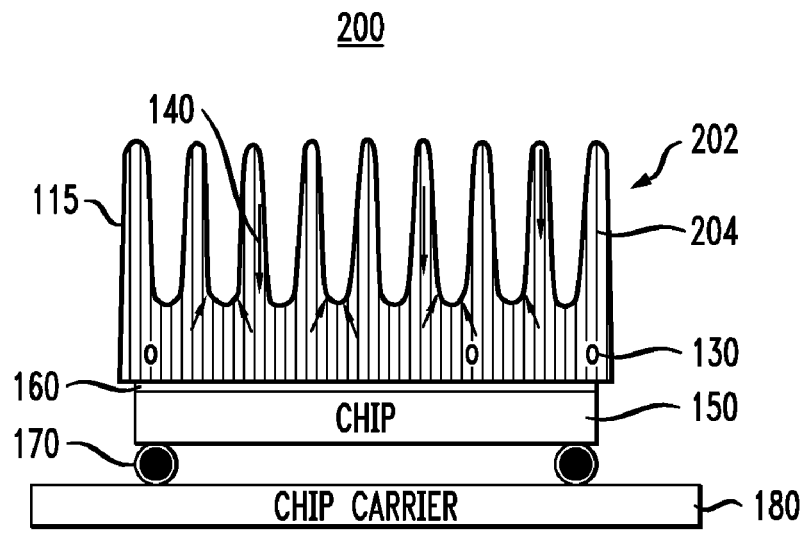
FIG. 2 shows a perspective view of an air-cooled fin shaped hollow heat sink with an embedded wick structure in accordance with another embodiment of the invention.

FIG. 2 shows a heat sink module 200 including an exemplary design of a wick-assisted fin-shaped vapor chamber 202. Except for the vapor chamber 202, the rest of the elements shown in FIG. 2 are similar to the elements shown in FIG. 1, and the description of such common elements is therefore not repeated. The design of the vapor chamber 202 can be helpful to provide for efficient cooling if a chip is mounted vertically or upside down. The embedded wick structure 204 provides a simple but reliable capillary mechanism configured to deliver the condensed liquid 140 from the cooling fins to the heated base and enables the vapor chamber 202 to operate effectively at all gravity orientations. The wick structure 204 can be made of thin sheets of metal or non-metal meshes and fiber bundles.

Figure 3:
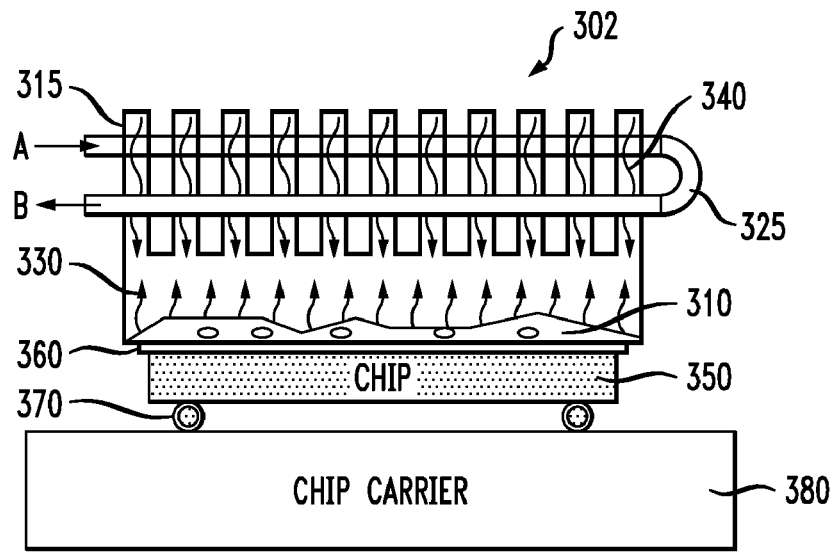
FIG. 3 shows a perspective view of a liquid-cooled fin-shaped hollow heat sink partially filled with fluid in accordance with another embodiment of the invention.

FIG. 3 shows a perspective view of a liquid-cooled fin-shaped hollow heat sink 302 that is partially filled with fluid. The heat sink 302 is designed in conjunction with a liquid cooling technique. The inventors have discovered that use of liquid cooling instead of air cooling not only improves the heat transfer efficiency, but also reduces the size of a heat sink required for similar heat flux density. As the liquid enters the heat sink 302 via inlet "A" and exits via outlet "B" of a pipe 325, the fins 315 of the heat sink 302 can be sufficiently cooled to achieve maximal efficiency. In an exemplary embodiment, the heat-sink 302 disposed over a top surface of at least one chip 350 is designed to have a slightly larger dimension than the chip 350 to further improve the cooling efficiency. The heat sink 302, which is partially filled with liquid 310, is glued to the chip 350 using a layer of thermal paste 360. The chip 350 is then bonded to a chip carrier 380 via solder balls 370. As the temperature of the chip 350 rises, the liquid 310 evaporates to produce vapor 330. The vapor 330 fills the interior of the heat sink 302 and eventually condenses on interior sidewalls of fins 315 of the heat-sink 302, the fins 315 being cooled by the liquid flowing in the pipe 325. The condensed liquid 340 would drip back to the base of the heat-sink 302 and be used in a subsequent cooling cycle. To maintain the boiling temperature within a desired range, it is preferred to have the liquid 310 partially fill the heat sink 302 under controlled temperature and pressure to gain maximum cooling efficiency.

Figure 4:
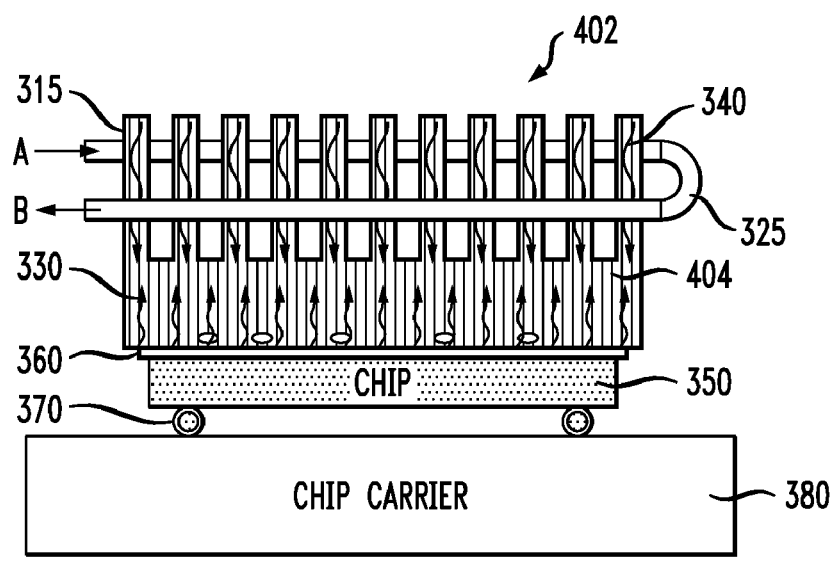
FIG. 4 shows a perspective view of a liquid-cooled fin-shaped hollow heat sink with embedded wick structure in accordance with another embodiment of the invention.

FIG. 4 shows a perspective view of a liquid-cooled fin-shaped hollow heat sink 402 with embedded wick structure 404 in accordance with another embodiment of the invention. The inventors have observed that such design in conjunction with liquid cooling provides for enhanced cooling efficiency if a chip is mounted vertically or upside down. As noted above, the embedded wick structure 404 provides a simple but reliable capillary mechanism configured to deliver the condensed liquid 340 from the cooling fins 315 back to the base, that is at a higher temperature relative to the temperature of the fins 315, and enables the heat sink 402 to operate effectively at all gravity orientations.

The combination of phase-change and liquid cooling can handle heat flux in the order of 200 W/cm². Room-temperature liquid-phase material that can be used to partially fill the vapor chamber of the heat sink 402 include fluorinated ketone such as 3M™ Novec 1230 [$CF_3CF_2C(O)CF(CF_3)_2$], which has a boiling temperature of about 49.2° C. Low-temperature liquid-phase material that can be used to partially fill the vapor chamber of the heat sink 402 include ECARO-25 [pentafluoroethane, $CF_3$—$CHF_2$], which has a boiling temperature of about −48.1° C. Other fluids such as water, ethanol, methanol, ammonia, or butane can also be used.

Figure 5:
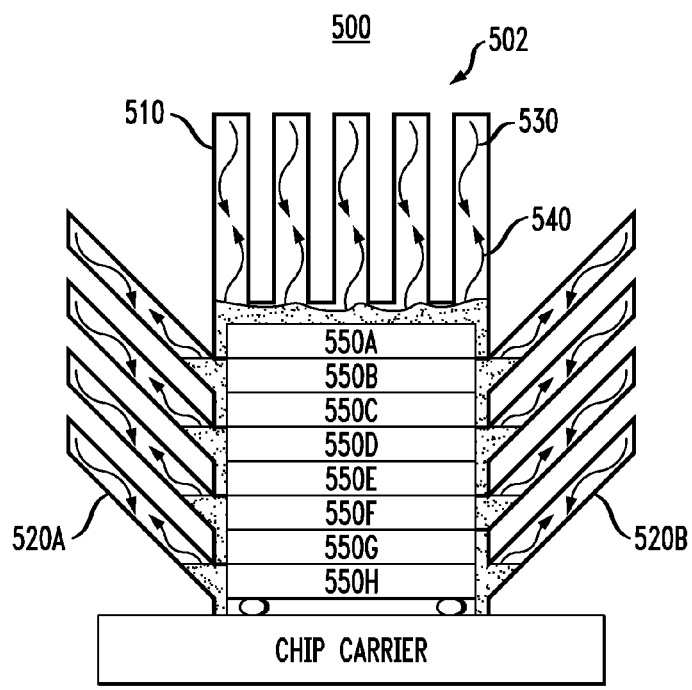
FIG. 5 is a perspective view of a fin-shaped vapor chamber design for a three-dimensional (3D) stacked integrated circuit (e.g., chip) package in accordance with an embodiment of the invention.

FIG. 5 is a perspective view of an angled vapor chamber design 502 for a three-dimensional (3D) stacked integrated circuit (e.g., chip) package in accordance with an embodiment of the invention. The vapor chamber 502 is designed to meet the heat flux demand of a three-dimensional stack-chip 550 as illustrated. The heat sink 500 includes a top vapor chamber 510, and multiple angled side chambers 520A and 520B. Hollow fins surrounding the stacked chips 550 are mounted at a tilted angle, preferably between 45° and 70°, to ensure backflow of condensed liquid by gravity. Chips 550A to 550H are stacked vertically where heat can be dissipated from an exterior surface of the stack structure 550. Liquid in each of the vapor chambers surrounding the chips 550A to 550H should preferably be filled to a level where it completely covers the sidewalls of the chips 550A to 550H in order to provide maximum surface contact and cooling capacity. In one embodiment, the top vapor chamber 510 and each fin of the side chambers 520A and 520B are built as separate units. Such units are then assembled and mounted on the stacked chips 550. Thermal paste is used to fill the gaps between adjacent chips (e.g., between 550A, 550B, and so on and so forth) and between the stacked chips 550 and the surrounding fin-shaped hollow heat sink 502.

Figure 6:
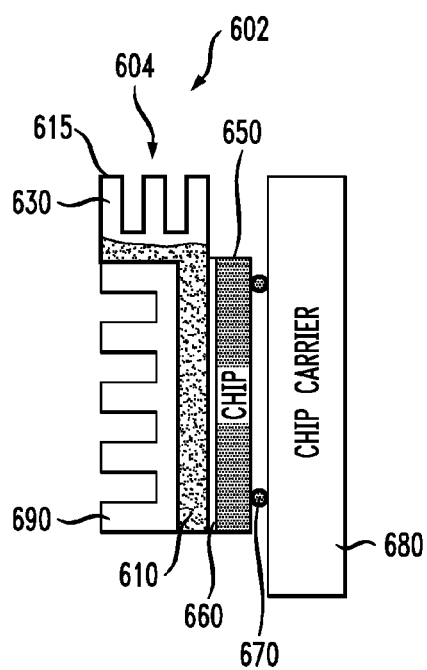
FIG. 6 shows a perspective view of a hybrid vapor chamber and heat sink structure for a vertically mounted chip in accordance with another embodiment of the invention.

FIG. 6 shows a perspective view of a heat sink structure 600 and a hybrid vapor chamber 602 for a vertically mounted chip in accordance with another embodiment of the invention. The embodiment shown in FIG. 6 combines a solid heat sink 690 and a hollow vapor chamber 604 to provide efficient cooling for chips that are mounted vertically on a package (e.g., chip carrier and a chip). The solid heat sink 690 and the hollow vapor chamber 604 are together illustrated as hybrid vapor chamber 602. The hybrid vapor chamber 602 includes a vertical section 610 that is sandwiched between a chip 650 on one side and the heat sink 690 on the other side. Thermal paste 660 is used to join the hollow vertical vapor chamber 610 to the chip 650 and the heat sink 690. The vertical section 610 is filled with liquid so that it covers an entire surface of the chip 650. The liquid filled in the vertical section 610 is heated by the chip 650 on one side thereby generating tiny bubbles that either rise to a top surface of the hollow chamber 604 or condense to liquid due to the cooling effect of heat sink 690. The bubbles that reach the top surface and become vapors 630 fill a fin-shaped top chamber 615 and condense upon contact with the cool surface of the fin structure 615. The temperature of the chip 650 can therefore be maintained below the boiling temperature of the liquid in the vapor chamber 604. It will be appreciated that the heat sink 690 can also be replaced by other cooling structures such as, for example, a thermoelectric module.

Figure 7:
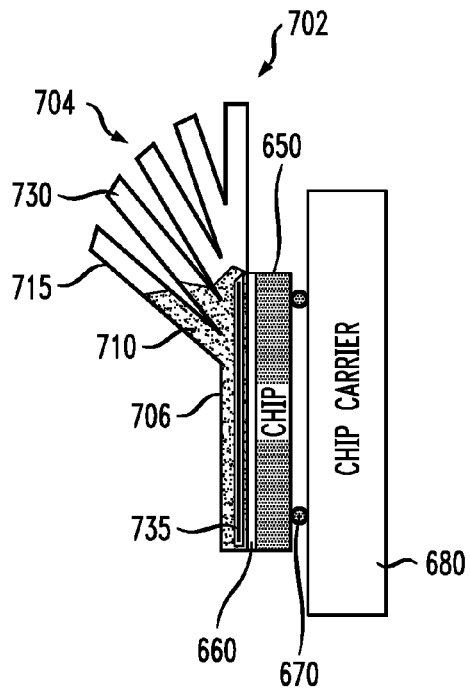
FIG. 7 shows a perspective view of an extended fin-shaped vapor chamber for vertically mounted chips in accordance with an embodiment of the invention.

FIG. 7 shows an alternative heat sink structure design 700 of the fin-shaped vapor chamber structure 702 for vertically mounted chips shown in FIG. 6. Elements similar to those shown in FIG. 6 are represented with same reference numerals. Without the use of a solid heat sink 690 shown in FIG. 6, fin-shaped branch chambers 704 can be extended from a top horizontal surface to a vertical side surface of the main vapor chamber 706. To enhance the thermal exchange between cooling liquid 710 and the chip 650, a highly thermal-conductive porous film 735 can be coated on a side surface of the vapor chamber 706, the side surface being in direct contact with the chip 650. In one exemplary embodiment, the highly thermal-conductive porous film can be like a sponge. Condensation of vapor 730 in fin structure 715 can be achieved, for example, either by air cooling through high-speed air flow, or via liquid cooling.

The hollow fin-shaped vapor chambers described above in FIGS. 1-7 in accordance with various embodiments can be constructed in different shapes and forms.

Figure 8:
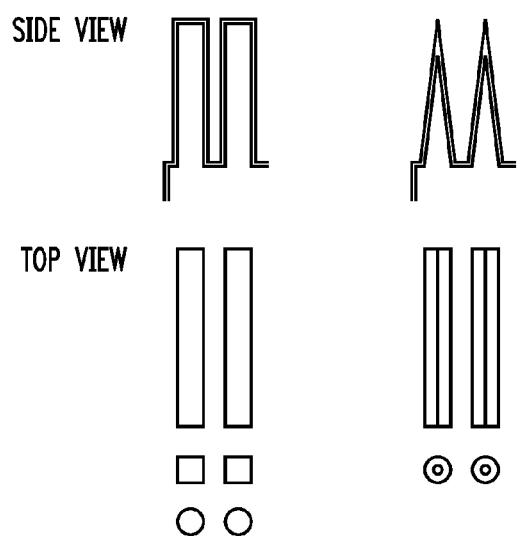
FIG. 8 shows side view and top view of fin structures of a vapor chamber in accordance with various embodiments of the invention.

FIG. 8 illustrates the side view and top views of some possible designs including triangular and rectangular prisms and pyramids, cones and cylinders.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An apparatus for removing heat from a semiconductor structure, comprising: a top vapor chamber having a plurality of three-dimensional (3D) shaped members and disposed on top of the semiconductor structure; a plurality of side vapor chambers each having another set of a plurality of three-dimensional (3D) shaped members, the side vapor chambers disposed to surround the semiconductor structure, the top vapor chamber and the side vapor chambers are configured to be fluidly coupled to enable transfer of fluid therebetween; the side vapor chambers are mounted at an angle to enable backflow of condensed fluid by gravity towards a base portion of the semiconductor structure, the base portion being in contact with a chip carrier; and wherein the top vapor chamber and the side vapor chambers are filled with a coolant so as to completely cover sidewalls and top exterior surface of the structure in order to provide maximum surface contact and cooling capacity.

2. The apparatus of claim 1, wherein the semiconductor structure comprises a three-dimensional stacked structure having a plurality of semiconductor chips, the plurality of chips being stacked vertically such that heat is dissipated from an exterior surface of the stacked structure.

3. The apparatus of claim 2, wherein thermally conductive material is used to fill gaps between adjacent semiconductor chips of the three-dimensional stacked structure.

4. The apparatus of claim 1, wherein the side vapor chambers are mounted at an angle between 45 degrees and 70 degrees.

* * * * *